United States Patent
VanGilder et al.

(10) Patent No.: US 11,188,214 B2
(45) Date of Patent: Nov. 30, 2021

(54) SYSTEMS AND METHODS FOR DETERMINING LIQUID COOLED ARCHITECTURES IN AN IT ROOM

(71) Applicant: SCHNEIDER ELECTRIC IT CORPORATION, Foxboro, MA (US)

(72) Inventors: James William VanGilder, Pepperell, MA (US); Stuart Michael Sheehan, Narragansett, RI (US); Michael B. Condor, Chelmsford, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/217,522

(22) Filed: Mar. 30, 2021

(65) Prior Publication Data

US 2021/0303145 A1    Sep. 30, 2021

Related U.S. Application Data

(60) Provisional application No. 63/002,403, filed on Mar. 31, 2020.

(51) Int. Cl.
  *G06F 3/0482*    (2013.01)
  *G06F 3/0484*    (2013.01)
  *H05K 7/20*     (2006.01)

(52) U.S. Cl.
  CPC ........ *G06F 3/04847* (2013.01); *G06F 3/0482* (2013.01); *H05K 7/20236* (2013.01); *H05K 7/20781* (2013.01)

(58) Field of Classification Search
  CPC ............ G06F 3/048–05; H05K 7/20218–2099
  See application file for complete search history.

(56) References Cited

U.S. PATENT DOCUMENTS 7,599,175 B1 * 10/2009 Ong ................... H05K 7/20727
                                                         206/307
8,355,890 B2 *  1/2013 VanGilder .............. G06Q 50/32
                                                         702/182

(Continued)

FOREIGN PATENT DOCUMENTS

EP          3500078 A1    6/2019

OTHER PUBLICATIONS

Extended European Search Report from corrresponding Eurpean Application No. 21166089.9 dated Aug. 20, 2021.

(Continued)

*Primary Examiner* — Daniel Rodriguez
(74) *Attorney, Agent, or Firm* — Lando & Anastasi, LLP

(57) ABSTRACT

Methods and systems for designing liquid cooled IT room architectures for an IT room using a graphical user interface include simultaneously displaying a configuration region and a results region in the graphical user interface, receiving a design parameter responsive to a user input of one of a plurality of user-selectable graphical user interface elements, determining a dielectric fluid return temperature based on an energy balance equation and a heat exchange equation, and responsive to receiving the design parameter and determining the dielectric fluid return temperature, dynamically displaying in the results region at least one of a first graph representing an amount of required room cooling power per a unit of area of the IT room or a second graph representing a surface temperature of at least one immersion-cooled equipment rack cooled by the architecture.

20 Claims, 14 Drawing Sheets

(56) References Cited

U.S. PATENT DOCUMENTS

| | | | | |
|---|---|---|---|---|
| 8,424,336 | B2* | 4/2013 | Bean, Jr. | F25D 17/02 |
| | | | | 62/434 |
| 8,701,746 | B2* | 4/2014 | Rohr | F25D 21/14 |
| | | | | 165/11.1 |
| 8,839,036 | B2* | 9/2014 | Rymeski | G06F 11/0709 |
| | | | | 714/26 |
| 9,357,671 | B2* | 5/2016 | Long | H05K 7/20136 |
| 9,845,977 | B2* | 12/2017 | Bean, Jr. | F25B 25/00 |
| 10,936,381 | B1* | 3/2021 | Poblete | H05K 7/1498 |
| 2005/0094774 | A1* | 5/2005 | VanGilder | H04Q 3/0058 |
| | | | | 379/52 |
| 2005/0097071 | A1* | 5/2005 | VanGilder | H04L 41/22 |
| | | | | 706/55 |
| 2005/0097512 | A1* | 5/2005 | VanGilder | G06F 8/34 |
| | | | | 717/113 |
| 2009/0113323 | A1* | 4/2009 | Zhao | H05K 7/20836 |
| | | | | 715/764 |
| 2009/0210813 | A1* | 8/2009 | Sawczak | H05K 7/20836 |
| | | | | 715/771 |
| 2011/0307820 | A1* | 12/2011 | Rasmussen | H05K 7/20836 |
| | | | | 715/771 |
| 2012/0005344 | A1* | 1/2012 | Kolin | H05K 7/20836 |
| | | | | 709/226 |
| 2012/0116590 | A1* | 5/2012 | Florez-Larrahondo | |
| | | | | G06F 1/206 |
| | | | | 700/275 |
| 2012/0245905 | A1* | 9/2012 | Dalgas | G06F 30/13 |
| | | | | 703/2 |
| 2013/0317785 | A1 | 11/2013 | Chainer et al. | |
| 2014/0054024 | A1* | 2/2014 | Chen | H05K 7/20209 |
| | | | | 165/247 |
| 2015/0025833 | A1* | 1/2015 | VanGilder | G06F 30/23 |
| | | | | 702/136 |
| 2016/0234972 | A1* | 8/2016 | Billet | H05K 7/20836 |
| 2018/0088607 | A1* | 3/2018 | Chainer | G06F 1/20 |

OTHER PUBLICATIONS

Chu Wen-Xiao et al: "A review on airflow management in data centers", Applied Energy, vol. 240, Feb. 14, 2019 (Feb. 14, 2019), pp. 84-119, XP085675844, ISSN: 0306-2619, DOI: 10.1016/J. APENERGY.2019.02.041.

Wan Jianxiong et al: "Air Flow Measurement and Management for Improving Cooling and Energy Efficiency in Raised-Floor Data Centers: A Survey", IEEE Access, vol. 6, Sep. 21, 2018 (Sep. 21, 2018), pp. 48867-48901, XP055831707, DOI: 10.1109/ACCESS. 2018.2866840 Retrieved from the Internet: URL:https://ieeexplore. ieee.org/elx7/6287639/8274985/08451865.pdf? tp=&arnumber= 8451865&isnumber=8274985&ref= aHR0cHM6Ly9zY2hvbGFyLmdvb2dsZS5jb20v>.

* cited by examiner

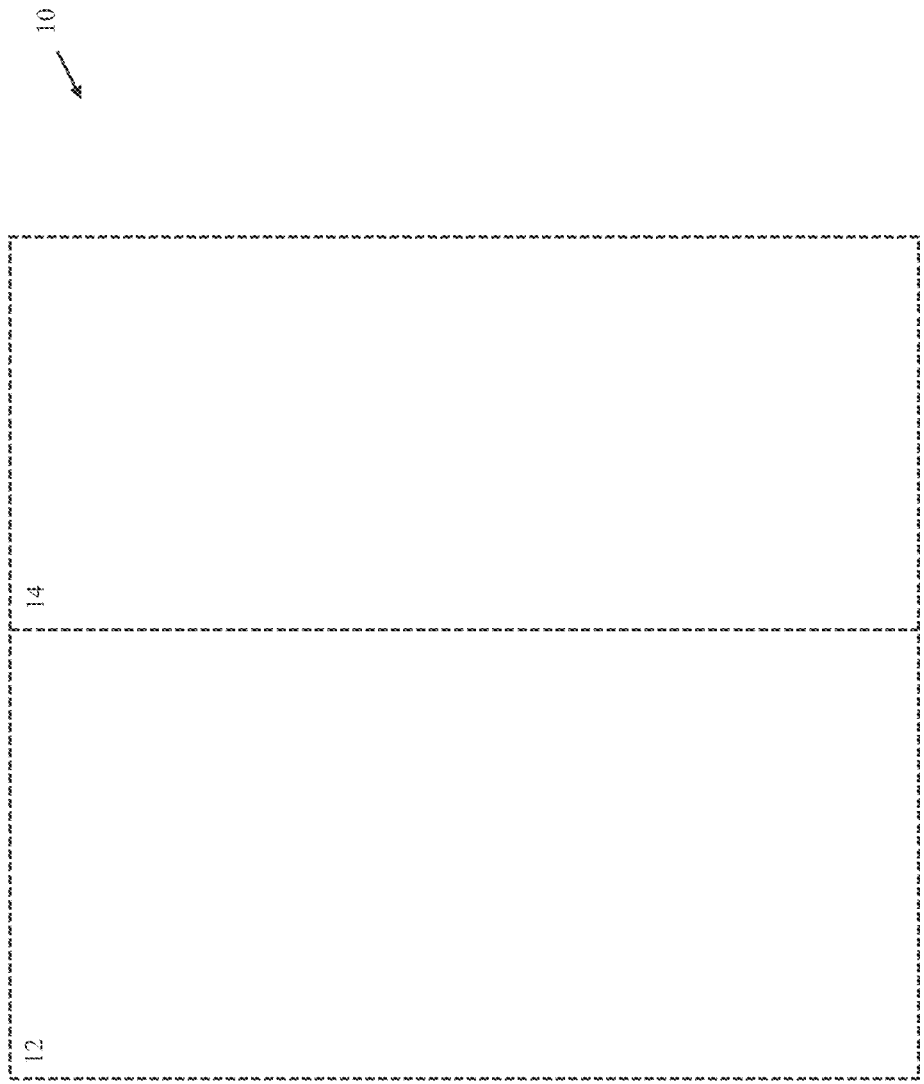

Immersion-Cooled Racks

Assumption:
The skin temperature of the server is equal to the dielectric fluid return temperature $T_h^{in}$ 27 —→ Rack Energy Balance
$$\dot{q}_{IT}^{r,imm} = \dot{C}_c^r(T_c^{out} - T_c^{in}) + \frac{A_{tot}(T_h^{in} - T_{amb})}{R_{amb}}$$

29 —→ HEX Effectiveness
$$\varepsilon_{HEX} = \frac{\dot{C}_c^r(T_c^{out} - T_c^{in})}{\dot{C}_{min}^r(T_h^{in} - T_c^{in})} = \frac{\dot{C}_h^r(T_h^{in} - T_h^{out})}{\dot{C}_{min}^r(T_h^{in} - T_c^{in})}$$

2 Equations; for 2 Unknowns: $T_h^{in}$, $T_c^{out}$

Solving (1) and (2) analytically we determine $T_h^{in}$ $$T_h^{in} = \left(\frac{1}{1+\omega}\right)\left(T_{amb} + \omega T_c^{in} + \frac{\dot{q}_{IT}^r R_{amb}}{A_{tot}}\right) \quad \text{where,} \quad \omega = \frac{\varepsilon_{HEX} \dot{C}_{min}^r R_{amb}}{A_{tot}}$$

From (2) we compute $T_c^{out}$ $$T_c^{out} = T_c^{in} + \varepsilon_{HEX}\left(\frac{\dot{C}_{min}^r}{\dot{C}_c^r}\right)(T_h^{in} - T_c^{in})$$

Then compute $T_h^{out}$ from alternative definition of $\varepsilon_{HEX}$ $$T_h^{out} = T_h^{in} - \varepsilon_{HEX}\left(\frac{\dot{C}_{min}^r}{\dot{C}_h^r}\right)(T_h^{in} - T_c^{in})$$

Subscripts
- c=cold stream
- h=hot stream
- amb=data center ambient
- tot=total (overall)

Superscripts
- r=rack

FIG. 3

Immersion-Cooled Racks - Thermal Resistance to Ambient, $R_{amb}$ $$R_{amb} = \frac{N_{sa} R_{amb}^{sa} + N_m R_{amb}^m + N_e R_{amb}^e}{N_{sa} + N_m + N_e}$$

$$N_{sa} = \begin{cases} N_{rows} & \text{if } N_{rpr} = 1 \\ 0 & \text{otherwise} \end{cases}$$

$$N_m = \begin{cases} 0 & \text{if } N_{rpr} = 1 \\ N_{rows}(N_{rpr} - 1) & \text{otherwise} \end{cases}$$

$$N_e = \begin{cases} 0 & \text{if } N_{rpr} = 1 \\ 2 N_{rows} & \text{otherwise} \end{cases}$$

Subscripts/Superscripts:
- sa=stand alone
- m=middle
- e=end
- rpr=racks per row

FIG. 5

Immersion-Cooled Racks - Thermal Resistance to Ambient, $R_{amb}$

* The CFD data is correlated by the expression $R_{amb} = \alpha \epsilon^{-\beta} \Delta T^{\gamma}$ where $\Delta T = |T_H^{th} - T_{amb}|$ and $\alpha$, $\beta$, and $\gamma$ are tabulated over a range of thermal emissivity $\epsilon$ and ambient temperature $T_{amb}$ values.

$$R_{amb} = \alpha \epsilon^{-\beta} \Delta T^{\gamma} \quad \text{where} \quad \Delta T = |T_H^{th} - T_{amb}|$$

| Parameter | Units |
|---|---|
| $R_{amb}^{eq}, R_{amb}^{in}, R_{amb}^{e}, \alpha$ | $\dfrac{m^2 \cdot °C}{W}$ |
| $\epsilon, \gamma$ | Dimensionless |
| $\beta$ | $°C^{-1}$ |
| $T_{amb}, \Delta T$ | $°C$ |

Overall CW temperature Leaving Pod

The overall temperature of the chilled water leaving the pod is a mixture of the water leaving all of the immersion-cooled and direct-to-chip cooled racks.

$$T_{CW}^{pod,out} = \frac{N_f^{immersion} C_f^I T_{CW,c}^{out} + N_f^{d2c} C_{CW}^I T_{CW}^{out}}{N_f^{immersion} C_f^I + N_f^{d2c} C_{CW}^I}$$

Minimum Floor Area Per Pod $$\text{Minimum Floor Area} = \begin{cases} (11.5 \, ft)(2 \, ft \, N_{ppr} + 8 \, ft) & \text{if } N_{rows} = 1 \\ (19 \, ft)(2 \, ft \, N_{ppr} + 8 \, ft) & \text{if } N_{rows} = 2 \end{cases}$$

FIG. 9

Piping Heat Transfer Calculations $$Nu_d = \left\{ 0.6 + \frac{0.387(Ra_d)^{1/6}}{\left[1 + (0.559/Pr)^{9/16}\right]^{8/27}} \right\}^2 = \frac{h_{piping} d}{k}$$

$$Ra = \frac{g\beta \Delta T d^3}{\alpha \nu} \qquad T_{piping} = \frac{1}{2}\left(T_c^{in} + T_c^{out}\right)$$

$$A_{piping} = \pi d L_{piping}$$

$$q_{piping} = h_{piping} A_{piping} \left(T_{piping} - T_{amb}\right)$$

FIG. 11

SYSTEMS AND METHODS FOR DETERMINING LIQUID COOLED ARCHITECTURES IN AN IT ROOM

CROSS-REFERENCE TO RELATED APPLICATION

This application claims priority to U.S. Provisional Application Ser. No. 63/002,403, titled "SYSTEMS AND METHODS FOR DETERMINING LIQUID COOLED ARCHITECTURES IN A DATA CENTER," filed on Mar. 31, 2020, which is incorporated herein by reference in its entirety.

BACKGROUND

1. Field of the Disclosure

At least one example in accordance with the present disclosure relates generally to tools for designing cooling systems in IT rooms.

2. Discussion of Related Art

Centralized IT rooms for computer, communications, and other electronic equipment contain racks of equipment that require power, cooling, and connections to external communication facilities. To increase efficiency, in IT room design, one may increase power density, delivering more power per rack of computing equipment. However, increased density of computing equipment may strain the cooling and power systems that service these facilities.

As power is consumed by computer equipment it is converted to heat. As a result, the cooling requirements of a facility may scale with the power consumption. IT rooms may utilize air plenums under raised floors, or in overhead spaces to distribute cooling air through an IT room. One or more computer room air conditioners (CRACs) or computer room air handlers (CRAHs) may be distributed along the periphery or inline of existing equipment within the data room. Perforated tiles may be placed in front, above, or beneath racks of equipment that are to be cooled to allow the cooling air from beneath the floor, from the ceiling, or adjacent to cool equipment within the racks.

Servers may be designed by server hardware specialists. Pod and room-level cooling architecture may be designed by IT room specialists. However, the design of one system directly affects the other. As one example, in the case of immersion-cooled servers, temperatures of the dielectric fluid circulating within the server may be directly linked to temperatures of the chilled water circulating generally outside of the server through a heat exchanger. Changes to the thermal environment on one side of the environment, directly impacts the other. In such cases, designing the systems separately may require numerous iterations, thereby making system optimization difficult.

SUMMARY

At least one embodiment is directed to a non-transitory computer-readable medium storing instructions that, when executed by one or more processors, cause the one or more processors to perform the steps comprising simultaneously displaying a configuration region and a results region in the graphical user interface, the configuration region including a plurality of user-selectable graphical user interface elements each corresponding to at least one equipment rack in the IT room, receiving a design parameter responsive to a user input of one of the plurality of user-selectable graphical user interface elements, determining a dielectric fluid return temperature TJ based on an energy balance equation and a heat exchange equation, and responsive to receiving the design parameter and determining the dielectric fluid return temperature, dynamically displaying in the results region at least one of a first graph representing an amount of required room cooling power per a unit of area of the IT room, the first graph being superimposed over a fixed plurality of room cooling ranges or a second graph representing a surface temperature of at least one immersion-cooled equipment rack cooled by the architecture, the second graph being superimposed over a fixed plurality of surface cooling ranges.

In one example, dynamically displaying in the results region comprises simultaneously displaying the first graph and the second graph in the results region.

In another example, dynamically displaying in the results region further comprises displaying at least one of a third graph representing a percentage of total heat load removed by liquid cooling in the architecture and/or air cooling in the architecture or a fourth graph representing a percentage of total heat load produced by the at least one immersion-cooled rack, at least one direct-to-chip-cooled rack, at least one air-cooled rack, or piping in the architecture.

In one example, determining the dielectric fluid return temperature comprises calculating an overall thermal resistance $R_{amb}$ between the ambient environment and external skin of the at least one immersion-cooled equipment rack.

In another example, $R_{amb} = \alpha e^{-\beta \Delta T^\gamma}$ where $\Delta T = |T_h^{in} - T_{amb}|$, $T_{amb}$ is an ambient room temperature, and $\alpha$, $\beta$ and $\gamma$ are previously-computed constants calculated over a range of thermal emissivity $\varepsilon$ and ambient temperature $T_{amb}$ values.

In one example, determining the dielectric fluid return temperature comprises retrieving a plurality of constants from one or more stored tables of simulation data generated from a plurality of previously completed computational fluid dynamics simulations.

In another example, the one or more stored tables include one table for stand-alone racks, one table for middle racks, or one table for end racks.

In one example, the one of the plurality of user-selectable graphical user interface elements is a slider and the user input is a change in a position of the slider, the position of the slider corresponding to the design parameter.

In another example, the first graph is a bar graph having a length and the second graph is a bar graph having a length, and responsive to the change in the position of the slider, the displayed length of the first bar graph and the displayed length of the second bar graph are automatically updated in real time.

In one example, the instructions, when executed by one or more processors, cause the one or more processors to perform the steps further comprising specifying a layout of the at least one equipment rack in the IT room responsive to a plurality of user inputs to one or more of the plurality of user-selected graphical user interface elements, the layout including one or more of a number of immersion-cooled equipment racks including the at least one immersion-cooled equipment rack, a number of the at least one direct-to-chip cooled equipment racks, a number of air-cooled equipment racks, or a length of piping.

In another example, the instructions, when executed by one or more processors, cause the one or more processors to perform the steps further comprising receiving the design parameter as a heat exchanger effectiveness at given reference dielectric fluid and chilled-water flowrates and receiving a second design parameter responsive to one of the plurality of user-selectable graphical user interface elements receiving a user input, the second design parameter being a cold plate effectiveness of the at least one direct-to-chip cooled equipment racks in the architecture.

At least one embodiment is directed to a system for designing a liquid cooled IT room architecture for an IT room with a graphical user interface, the system comprising at least one processor configured to simultaneously display a configuration region and a results region in the graphical user interface, the configuration region including a plurality of user-selectable graphical user interface elements each corresponding to at least one equipment rack in the IT room, receive a design parameter responsive to a user input of one of the plurality of user-selectable graphical user interface elements, determine a dielectric fluid return temperature $T_h^{in}$ based on an energy balance equation and a heat exchange equation, and responsive to determining the dielectric fluid return temperature, dynamically display in the results region at least one of a first graph representing an amount of required room cooling power per a unit of area of the IT room, the first graph being superimposed over a fixed plurality of room cooling ranges or a second graph representing a surface temperature of at least one immersion-cooled equipment rack cooled by the architecture, the second graph being superimposed over a fixed plurality of surface cooling ranges.

In another example, the first graph and the second graph are simultaneously displayed in the results region.

In one example, dynamically display in the results region further comprises displaying at least one of a third graph representing a percentage of total heat load removed by liquid cooling in the architecture and/or air cooling in the architecture or a fourth graph representing a percentage of total heat load produced by the at least one immersion-cooled rack, at least one direct-to-chip-cooled rack, at least one air-cooled rack, or piping in the architecture.

In another example, the at least one processor is configured to determine the dielectric fluid return temperature by calculating an overall thermal resistance $R_{amb}$ between the ambient environment and external skin of the at least one immersion-cooled equipment rack.

In one example, $R_{amb}=\alpha e^{-\beta \Delta T^\gamma}$ where $\Delta T=|T_h^{in}-T_{amb}|$, $T_{amb}$ is an ambient room temperature, and $\alpha$, $\beta$ and $\gamma$ are previously-computed constants calculated over a range of thermal emissivity $\varepsilon$ and ambient temperature $T_{amb}$ values.

In another example, the at least one processor is configured to determine the dielectric fluid return temperature by retrieving a plurality of constants from one or more stored tables of simulation data generated from a plurality of previously completed computational fluid dynamics simulations.

In one example, the one or more stored tables include one table for stand-alone racks, one table for middle racks, or one table for end racks.

In another example, the one of the plurality of user-selectable graphical user interface elements is a slider and the user input is a change in a position of the slider, the position of the slider corresponding to the design parameter.

In one example, the first graph is a bar graph having a length and the second graph is a bar graph having a length, and the at least one processor is further configured to, responsive to the change in the position of the slider, automatically update the displayed length of the first bar graph and the displayed length of the second bar graph in real time.

In another example, the at least one processor is further configured to specify a layout of the at least one equipment rack in the IT room responsive to a plurality of user inputs to one or more of the plurality of user-selected graphical user interface elements, the layout including one or more of a number of immersion-cooled equipment racks including the at least one immersion-cooled equipment rack, a number of at least one direct-to-chip cooled equipment racks, a number of air-cooled equipment racks, or a length of piping.

In one example, the design parameter is a heat exchanger effectiveness at given reference dielectric fluid and chilled-water flowrates, and the at least one processor is further configured to receive a second design parameter responsive to one of the plurality of user-selectable graphical user interface elements receiving a user input, the second design parameter being a cold plate effectiveness of the at least one direct-to-chip cooled equipment racks in the architecture.

At least one embodiment is directed to a method of designing a liquid cooled IT room architecture for a IT room with a graphical user interface, the method comprising simultaneously displaying a configuration region and a results region in the graphical user interface, the configuration region including a plurality of user-selectable graphical user interface elements each corresponding to at least one equipment rack in the IT room, receiving a design parameter responsive to a user input of one of the plurality of user-selectable graphical user interface elements, determining a dielectric fluid return temperature $T_h^{in}$ based on an energy balance equation and a heat exchange equation, and responsive to receiving the design parameter and determining the dielectric fluid return temperature, dynamically displaying in the results region at least one of a first graph representing an amount of required room cooling power per a unit of area of the IT room, the first graph being superimposed over a fixed plurality of room cooling ranges, or a second graph representing a surface temperature of at least one immersion-cooled equipment rack cooled by the architecture, the second graph being superimposed over a fixed plurality of surface cooling ranges.

In one example, the first graph and the second graph are simultaneously displayed in the results region.

In another example, dynamically displaying in the results region further comprises displaying at least one of a third graph representing a percentage of total heat load removed by liquid cooling in the architecture and/or air cooling in the architecture, or a fourth graph representing a percentage of total heat load produced by the at least one immersion-cooled rack, at least one direct-to-chip-cooled rack, at least one air-cooled rack, or piping in the architecture.

In one example, determining the dielectric fluid return temperature further comprises calculating an overall thermal resistance $R_{amb}$ between the ambient environment and external skin of the at least one immersion-cooled equipment rack.

In another example, $R_{amb}=\alpha e^{-\beta \Delta T^\gamma}$ where $\Delta T=|T_h^{in}-T_{amb}|$, $T_{amb}$ is an ambient room temperature, and $\alpha$, $\beta$ and $\gamma$ are previously-computed constants calculated over a range of thermal emissivity $\varepsilon$ and ambient temperature $T_{amb}$ values.

In one example, determining the dielectric fluid return temperature comprises retrieving a plurality of constants from one or more stored tables of simulation data generated from a plurality of previously completed computational fluid dynamics simulations.

In another example, the one or more stored tables include one table for stand-alone racks, one table for middle racks, or one table for end racks.

In one example, the one of the plurality of user-selectable graphical user interface elements is a slider and the user input is a change in a position of the slider, the position of the slider corresponding to the design parameter.

In another example, the first graph is a bar graph having a length and the second graph is a bar graph having a length, and responsive to the change in the position of the slider, the displayed length of the first bar graph and the displayed length of the second bar graph are automatically updated in real time.

In one example, the method further comprises specifying a layout of the at least one equipment rack in the IT room responsive to a plurality of user inputs to one or more of the plurality of user-selected graphical user interface elements, the layout including one or more of a number of immersion-cooled equipment racks including the at least one immersion-cooled equipment rack, a number of the at least one direct-to-chip cooled equipment racks, a number of air-cooled equipment racks, or a length of piping.

In another example, the method further comprises receiving the design parameter as a heat exchanger effectiveness at given reference dielectric fluid and chilled-water flowrates, and receiving a second design parameter responsive to one of the plurality of user-selectable graphical user interface elements receiving a user input, the second design parameter being a cold plate effectiveness of the at least one direct-to-chip cooled equipment racks in the architecture.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1 illustrates an example graphical user interface of a thermal design tool for IT rooms housing one or more liquid-cooled pods of racks in accordance with various embodiments of the disclosure;

FIG. 3 illustrates an example calculation for immersion cooled racks of a thermal design tool for IT rooms housing one or more liquid-cooled pods of racks in accordance with various embodiments of the disclosure;

FIG. 5 illustrates an example calculation of thermal resistances for immersion cooled racks of a thermal design tool for IT rooms housing one or more liquid-cooled pods of racks in accordance with various embodiments of the disclosure;

FIG. 6 illustrates an example thermal-resistance correlation calculation for ambient temperatures for immersion cooled racks of a thermal design tool for IT rooms housing one or more liquid-cooled pods of racks in accordance with various embodiments of the disclosure;

FIG. 7 illustrates example thermal-resistance interpolation tables for immersion cooled racks of a thermal design tool for IT rooms housing one or more liquid-cooled pods of racks in accordance with various embodiments of the disclosure;

FIG. 9 illustrates an example calculation for chilled-water temperature and floor area of a thermal design tool for IT rooms housing one or more liquid-cooled pods of racks in accordance with various embodiments of the disclosure;

FIG. 11 illustrates an example piping heat transfer calculation of a thermal design tool for IT rooms housing one or more liquid-cooled pods of racks in accordance with various embodiments of the disclosure;

DETAILED DESCRIPTION

Figure 2A:
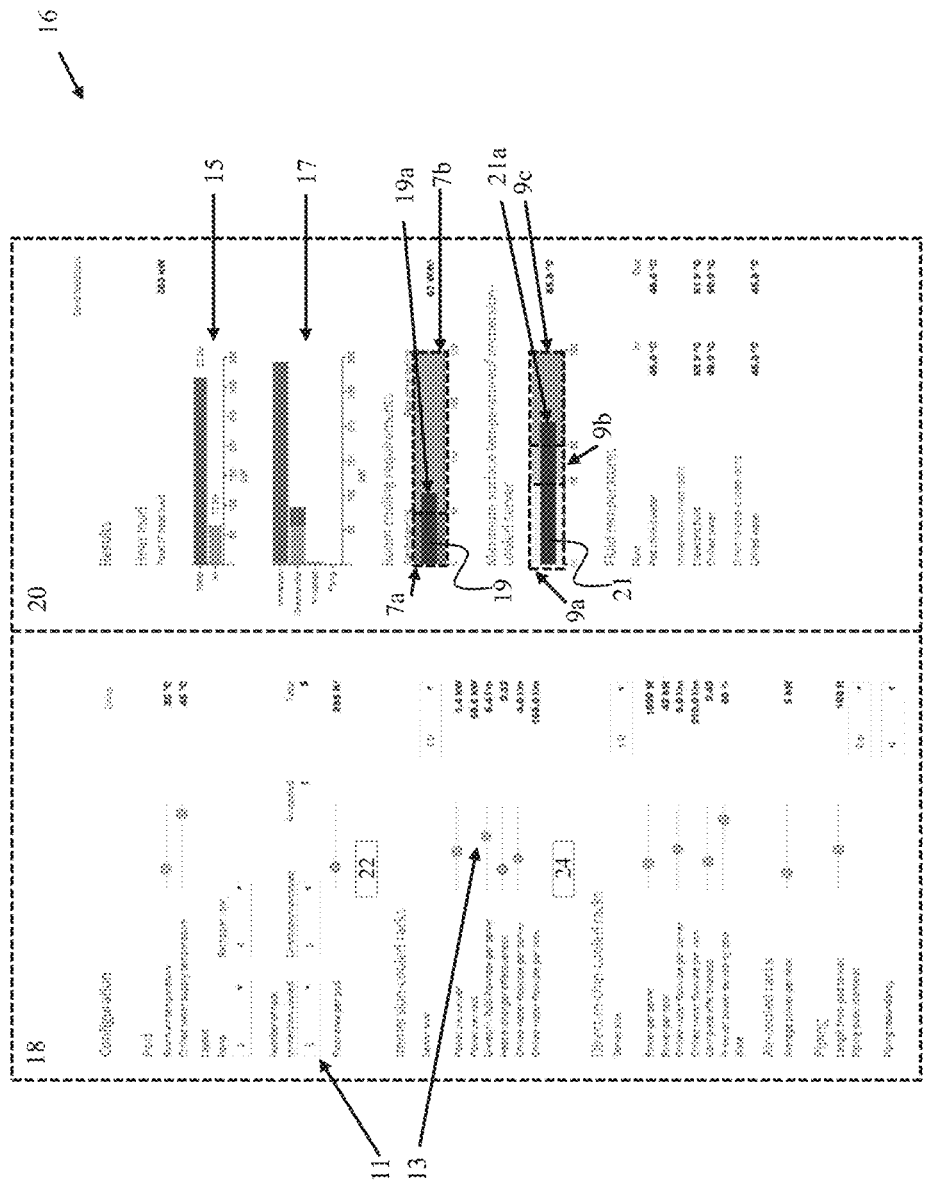
FIG. 2A illustrates an example display of a graphical user interface including various characteristics of a thermal design tool for IT rooms housing one or more liquid-cooled pods of racks in accordance with various embodiments of the disclosure.

A liquid-cooled-server manufacturer may functionally verify the cooling performance of one or more servers for a given set of operating conditions, e.g., liquid supply rates and temperatures, ambient room temperature, etc. Some manufacturers may not characterize the cooling performance of such systems in an actual IT room architecture or a specific IT room configuration of interest to a given end user. Further, typically no guidance is provided to the end user regarding the effect of the liquid-cooled IT equipment on the overall data-center room (air) cooling. For example, in the case where a sufficiently large percentage of the IT equipment in the IT room is liquid cooled, traditional expensive and energy-intensive cooling systems (typically used in traditional air-cooled IT rooms) may not be required. In any case, the IT and room cooling are intimately coupled and the design of both systems must be considered concurrently. An IT room is a room that holds IT (Information Technology) equipment (e.g., servers, UPSs (uninterruptable power supplies), cooling equipment, etc.). One example of an IT room is a data center.

IT room environments may consist of a large number of servers installed in a rack, with multiple racks arranged in rows or 2-row pods. The specific physical arrangement of such systems may affect the cooling performance. As one example, when a server is "racked," the top surface of the uppermost server and the bottom surface of the lowest server may be exposed to ambient temperatures inside the rack.

The other intermediate surfaces may be at similar temperatures so that there is little or no heat transfer. Furthermore, the heat transfer between the server skin and the room (which may also establish how much heat is transferred to the chilled water) may be difficult to determine and may include natural convection and/or thermal radiation. It may be impractical to physically test many possible configurations given the large number of possible configurations, thermal network type (hand or spreadsheet) predictions may provide insufficient accuracy. While detailed Computational Fluid Dynamics (CFD) simulations may provide more accuracy by modeling the heat transfer between the outer server skin and the room environment, CFD may be impractical as a near real-time design tool for simultaneously modeling the combined internal and external server environments, due in part to the computationally intensive nature of CFD. There is currently no way for IT room designers to visualize how changes in the layout of a pod of server racks (with a mixed population of immersion-cooled, direct-to-chip-cooled, and air-cooled cooling types) will affect changes in room cooling requirements and skin surface temperature of immersion-cooled servers (if any).

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for description purposes and should not be regarded as limiting. The use of "including," "comprising," "having," "containing," "involving," and variations herein, are meant to be open-ended, i.e. "including but not limited to."

Exemplary systems and methods described herein may solve at least the above problems by providing a real-time or near real-time thermal analysis of at least one of the server side or the external environment such that practical datacenter level architectures can be designed and optimized.

Systems and methods for determining liquid cooled IT room architectures are provided. A method for determining liquid cooled IT room architectures may comprise, receiving data regarding each of a plurality of IT room equipment in an IT room environment and displaying characteristics of the plurality of IT room equipment in an IT room environment based on the received data. One embodiment may include a web-based trade-off-style tool for computing cooling requirements of liquid-cooled server pods in an IT room. Such a tool may facilitate the analysis of a single pod comprised of any combination of immersion-cooled, direct-to-chip-cooled, and air-cooled racks.

"Immersion-cooled" may include "partially-immersed" systems where some amount of dielectric fluid is circulated throughout the server and can pool in the bottom of the server, typically, after being pumped directly onto hot server components. This method is somewhat different than the "bathtub" style immersion cooling where the server is completely immersed and cooled only by natural convection.

Some embodiments of this disclosure contemplate a calculation technique which uses the results of "offline" CFD simulations to provide simpler real-time thermal calculations. Some embodiments may include a "flow-dependent" heat exchanger effectiveness option which allows the user to specify the effectiveness at given reference dielectric fluid and chilled-water flowrates. A model may then automatically adjust effectiveness as the user varies flowrates.

Some embodiments include a "cold plate effectiveness" coefficient for direct to chip servers as the fraction of IT component (e.g., a CPU or GPU) heat that is removed by the cold-plate fluid serving the IT component. Further, scenarios assuming that the immersion-cooled server skin temperature is equal to return temperature of the dielectric fluid— essentially the fluid pooled at the bottom of the server are contemplated in various embodiments. Such scenarios are important to reducing the number of unknowns to that of the number of available equations.

Additional embodiments include, identifying specific conditions when the total heat load to the room air is very low and cooling may be adequately provided by "comfort cooling" systems. This may lead to new IT room cooling architectures or the concept of a "cooling out" IT room where the air is not actively cooled but "floats" to the point where all heat is removed (most efficiently) through the chilled water. This scenario may imply that cooling redundancy (on the air side) may not be required.

Current systems with a graphical user interface for designing a liquid cooled IT room architecture may not provide a visual indicator of how a determined dielectric fluid return temperature and changes to a design parameter alter an amount of required room cooling power per unit area or surface temperature of an immersion-cooled equipment rack in a meaningful manner to IT-room designers. This is a technical problem. An exemplary embodiment of a system for designing a liquid cooled IT room architecture may comprise a processor that performs steps including simultaneously displaying a configuration region and a results region, where the configuration region includes user-selectable elements corresponding to at least one rack in an IT room. The system may receive a design parameter responsive to a user input and determine a dielectric fluid return temperature based on an energy balance equation and heat exchange equation. The system may, responsive to receiving the design parameter and determining the temperature, display a graph representing required room cooling power superimposed over room cooling ranges. In some embodiments, instead or in addition, the system may display a graph representing surface temperature of an immersion-cooled equipment rack superimposed over surface cooling ranges. At least this foregoing combination of features comprises a system with a graphical user interface for designing a liquid cooled IT room architecture that serves as a technical solution to the foregoing technical problem. This technical solution is not routine and is unconventional. This technical solution is a practical application of a computer-aided-design system that solves the foregoing technical problem and constitutes an improvement in the technical field of software design for IT-room computer-aided-design applications at least by facilitating a meaning visual indicator of how a determined dielectric fluid return temperature and changes to a design parameter alter an amount of required room cooling power per unit area or surface temperature of an immersion-cooled equipment rack.

FIG. 1 illustrates an example graphical user interface (GUI) generally indicated at 10 for designing liquid cooled IT room architectures. The GUI 10 includes a first region 12 and a second region 14. Each of the regions 12, 14, of the GUI 10 may be configured to display user-selectable elements (e.g., drop down menus, radio buttons, sliders, text boxes, etc.) and/or display information calculated by one or more processors. In one example, the first region 12 includes one or more GUI elements for receiving user input(s) and the second region 14 displays output(s) produced that are responsive to the input(s) being received by the one or more processors. It is understood that changing the exact number and arrangement of regions in the GUI is readily apparent to one having ordinary skill in the art. In an example, the first region 12 includes a GUI button that opens a separate window for advanced options for inputting data.

For immersion-cooled servers, energy balance and heat exchanger calculations may be used in computing the thermal resistance $R_{amb}$ between the external server skin and the surrounding room ambient. These latter physics may be captured in CFD simulations, which may be reduced to correlations and table interpolation. As $R_{amb}$ depends on computed temperatures, temperature calculations are iterative, initial temperatures are assumed so that $R_{amb}$ may be estimated. Next, new temperatures are computed which can be used to further improve the estimate of $R_{amb}$. The process may then repeat until there are no further significant changes in $R_{amb}$.

For direct-to-chip-cooled servers, a "cold plate effectiveness" may be defined as the fraction of IT (chip) heat that is removed by the cold-plate fluid and a "% server power served by cold plate". With these values assumed, the fractions of heat released to the air are known so that the external server skin temperature and $R_{amb}$ may not be needed.

Some embodiments of the disclosure contemplate computing the heat transfer between the chilled-water pipes and the room air as this may add to the room heat load.

Some embodiments of the available outputs for designing liquid cooled IT room architectures may include, a breakdown of how heat produced by immersion-cooled, direct-to-chip-cooled, and/or air-cooled racks is removed—e.g., by air or water cooling. Any room (air) cooling requirements on a $W/ft^2$ or ($W/m^2$) basis and an indication of when the design heat load is in the "comfort cooling" or "IT room cooling" regimes. A displayed maximum surface temperature of immersion-cooled racks may be used to ensure compliance with maximum touch-surface-temperature limits. Calculations may include a table of fluid temperatures "in" and "out" of all equipment and the entire pod in aggregate.

In designing a liquid cooling architecture (e.g., including immersion cooling and/or direct-to-chip architectures) for an IT room, if one had unlimited time, then full CFD simulations of the room housing the IT equipment to be cooled would be performed for every design iteration. Consequently, a major drawback is that thousands of simulations are needed in a short period of time, and it can take weeks of computation time to compute just a few thousand full CFD simulations of a server pod with two rows of servers and 4 racks per row, for example.

Examples described herein include a web-based design tool for designing liquid cooling-based architectures in various types of structures (e.g., IT room, office building, warehouse). Such a design tool is shown by the GUI generally indicated at 16 in FIG. 2A. The GUI 16 is divided into two regions: a configuration region 18 and a results region 20. The configuration region differs from the results region primarily in that the configuration region includes a plurality of user-selectable graphical user interface elements. Some of these selectable elements include drop down menus 11 and sliders 13. When a user selects a value from a list in the drop-down menu or changes the position of the button of a slider, a value in the design tool is updated for subsequent cooling calculation processing.

Though the results region 20 does not include user-selectable GUI elements like the configuration region 18, the results region displays a plurality of graphs 15, 17, 19, 21 that dynamically update in real-time as user-inputs are provided through GUI elements in the configuration region 18. Every cooling architecture will vary in design based on a number of factors including the number of equipment racks being cooled, the type of cooling for each rack, the cooling minimum or maximum requirements of the ambient space, and so on.

Within the results region 20 is a first graph 19 and a second graph 21. The first graph 19 is superimposed over a fixed plurality of room cooling ranges including a first room cooling range 7a and a second room cooling range 7b. The second graph 21 is superimposed over a fixed plurality of surface cooling ranges including a first surface cooling range 9a, a second surface cooling range 9b, and a third surface cooling range 9c. In an example, the first graph 19 represents an amount of power consumed per a unit of area (e.g., $W/ft^2$ or $W/m^2$) of the IT room. The first graph 19 is superimposed over the first room cooling range 7a and second room cooling range 7b, terminating at an edge 19a in the second room cooling range 7b. In the example of FIG. 2A, the first room cooling range 7a extends from 0 $W/ft^2$ to about 50 $W/ft^2$ and the second room cooling range 7b extends from about 50 $W/ft^2$ to 200 $W/ft^2$. As shown in FIG. 2A, the edge 19a of the first graph 19 indicates a value in the second room cooling range 7b. In some examples, the first room cooling range 7a is a "comfort cooling" range and the second cooling range 7b is an "IT room cooling" range or "data center cooling" range. The second graph 21 represents a maximum surface temperature of at least one immersion-cooled equipment rack cooled by the architecture being designed. In one example, the second graph 21 includes a first surface cooling range 9a from 10° C. to 45° C., a second surface cooling range 9b from 45° C. to 60° C., and a third surface cooling range 9c from 60° C. to 100° C. The second graph 21, as shown in FIG. 2A, terminates at an edge 21a, which corresponds to a maximum surface temperature value in the third surface cooling range 9c.

It is understood that the ranges described above are one example and those in the field may set different ranges depending on their unique design requirements. As the user-selectable GUI buttons are manipulated to change in value, such as the sliders 13 being adjusted, the first graph 19 and/or the second graph 21 increase or decrease in value, thereby changing the position of their corresponding edge 19a, 21a, while the corresponding range 7a, 7b, 9a, 9b, 9c remains fixed, thereby allowing immediate results to a user for iteratively fine tuning design parameters to achieve a design goal (e.g., comfort cooling and a maximum surface temperature of less than 60° C.).

An example of a design parameter is power per server. Another example of a design parameter is power per rack. In some examples, for immersion-cooled racks, design parameters may include, but are not limited to power per sever, power per rack, dielectric fluid flowrate per server, heat exchanger effectiveness, chilled water flowrate per server, or chilled water flowrate per rack. In some examples, for direct-to-chip-cooled racks, design parameters may include, but are not limited to power per server, power per rack, chilled flowrate per server, chilled flowrate per rack, cold plate effectiveness, or % server power served by cold plate. Other design parameters include pod room air temperature, pod chilled water supply temperature, layout with number of rows and number of racks per row, number of immersion-cooled servers per rack, number of direct-to-chip-cooled servers per rack, floor area per pod average power per rack for air-cooled racks, piping length from pod to wall, piping outer diameter, or piping redundancy.

In certain embodiments, these ranges are specified automatically and are based on the particular set of user inputs in the configuration region 18. In other embodiments, these ranges are manually set by a user, and then retained by the controller when the user subsequently accesses the GUI 16 in the future (e.g., save the user's login credentials in the cloud, on a local server, etc.).

Because the configuration region 18 and the results region 20 can be displayed simultaneously (i.e., in real-time on the same screen or display), and the first graph 19 and the second graph 21 can be configured to be dynamically updated responsive to users entering new design parameters into the tool via one of the GUI elements in the configuration section 18, a user can easily and quickly see the effects of making adjustments in the configuration region 18. As an example, a user may want to design a disruptive IT equipment cooling architecture that is both efficient enough to be integrated into an office setting (e.g., in a comfort cooling range) and handled by existing cooling equipment, and is safe to the touch (e.g., in a safe/lower maximum surface temperature range). Keeping the temperature ranges of a particular design in the forefront of the results region 20 enables efficient adjustments, corrections, and improvements to be made by a user of the design tool.

The results section 20 may include a third graph 15 representing a percentage of total heat load produced by liquid cooling in the architecture being designed and/or air cooling in the architecture, and a fourth graph 17 representing a percentage of total heat load produced by the at least one immersion-cooled rack, at least one direct-to-chip-cooled rack, at least one air-cooled rack, or piping in the architecture. In the example architecture being designed in the GUI 16, as shown in FIG. 2A, both liquid and air types of cooling are included, as well as immersion-cooled racks, direct-to-chip cooled racks, and air-cooled racks. In other architectures being designed using the GUI 16, any number of different rack types may be included. In one example, an architecture includes only immersion-cooled racks and direct-to-chip cooled racks, and no air-cooled racks.

Figure 2B:
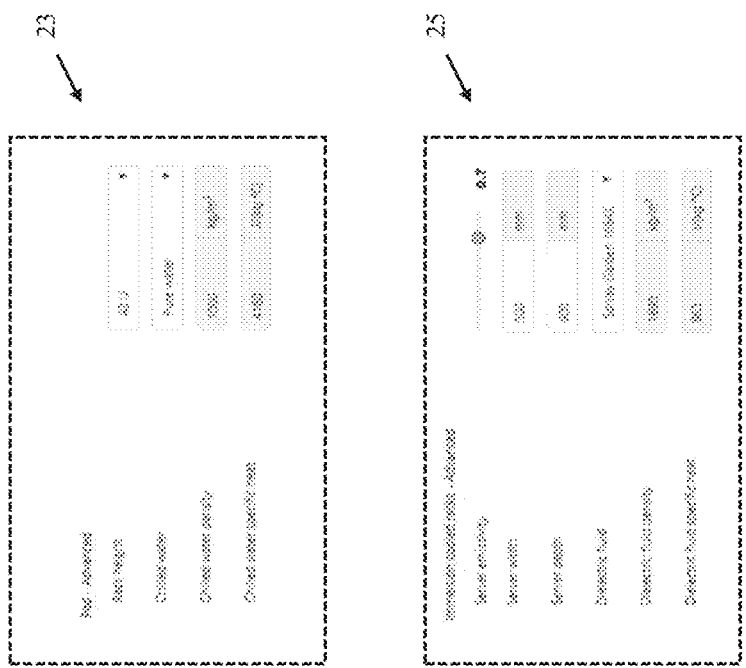
FIG. 2B illustrates an example display of a graphical user interface including various characteristics of a thermal design tool for IT rooms housing one or more liquid-cooled pods of racks in accordance with various embodiments of the disclosure.

In certain embodiments, additional GUI elements (i.e., buttons 22, 24) are provided in the configuration region 18. When the first button 22 is pressed, the GUI 16 overlays a smaller advanced pod window 23, as shown in FIG. 2B. Similarly, when the second button 24 is pressed, the GUI 16 overlays a smaller advanced immersion cooling window 25. It is understood that the terms "press," "select," "click," "touch" and the like, as used herein refer to those actions understood by those of skill in the art that are user for selecting GUI elements (e.g., mouse clicking, touch screen touching with stylus or finger).

FIG. 3 illustrates an example calculation for immersion cooled racks for designing liquid cooled IT room architectures using a GUI (e.g., the GUI 16). A system of equations is formed by an energy balance equation 27 and a heat exchange equation 29. Some quantities required (e.g., $R_{amb}$) in the calculation of the energy balance equation 27 and the heat exchange equation 29 are further described in other figures provided herein (e.g., see FIG. 5 for the calculation of $R_{amb}$).

Figure 4:
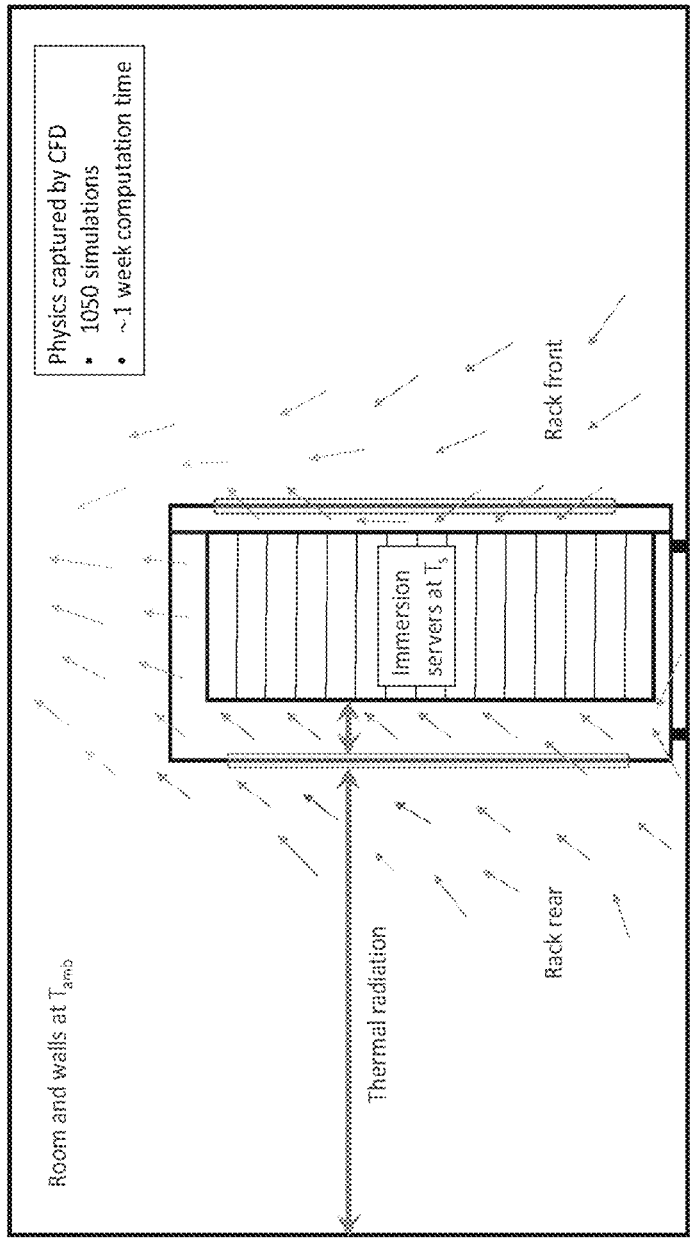
FIG. 4 illustrates modes of heat transfer between servers and the surrounding room environment of a thermal design tool for IT rooms housing one or more liquid-cooled pods of racks in accordance with various embodiments of the disclosure.

FIG. 4 illustrates modes of heat transfer between the servers and the surrounding room environment for designing liquid cooled IT room architectures using a GUI (e.g., the GUI 16) as described herein. The equipment rack layout provided by example in FIG. 4 is, in certain embodiments, a layout used to calculate over 1000 CFD simulations.

FIG. 5 illustrates an example calculation of thermal resistances for immersion cooled racks for designing liquid cooled IT room architectures. The overall thermal resistance between the external server skin and the ambient temperature, $R_{amb}$, depends on various temperatures, but for the sake of design time constraints, one may assume temperatures are known (for purposes of computing $R_{amb}$) then iteratively solve for temperatures and update $R_{amb}$ until no further changes occur. $R_{amb}$ includes natural convection and thermal radiation between the servers and the rack skin and the rack skin and the ambient room. $R_{amb}$ is a function of server emissivity, $\Delta T$ (the difference between the server skin temperature $T_h^{in}$ and the ambient room temperature $T_{amb}$), and the ambient temperature $T_{amb}$. CFD simulations were analyzed in which these design parameters were varied. Using curve fitting, correlations for $R_{amb}$ were determined. Since $R_{amb}$ is different for stand-alone, middle, and end rack positions, $R_{amb}$ is weighted based on the number of each type of rack position in pod configuration as shown below.

Of note, this approach is technically only correct when all racks in pod are immersion-cooled; otherwise it is just a statistically reasonable guess. Averaging $R_{amb}$ as shown is not precisely correct either because each rack type technically would have different server-skin and dielectric fluid temperatures—which are averaged together in certain embodiments.

FIG. 6 illustrates an example thermal-resistance correlation calculation for ambient temperatures for immersion-cooled racks such as those described above.

Figure 7:
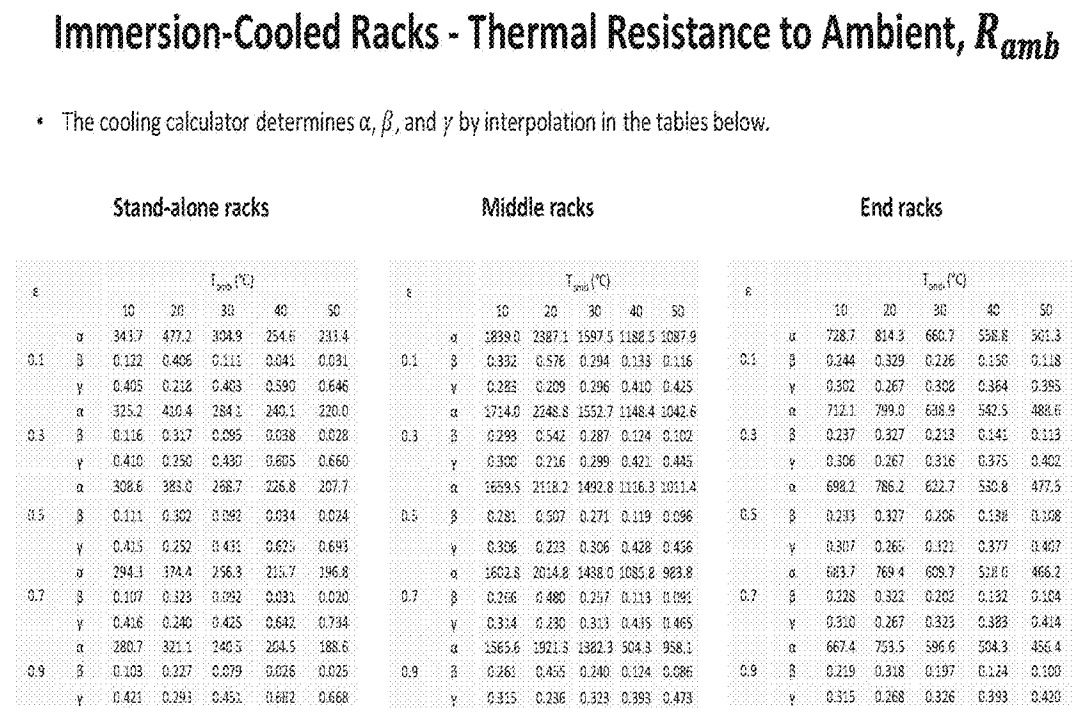

FIG. 7 illustrates example thermal-resistance interpolation tables for immersion-cooled racks for designing liquid cooled IT room architectures using a GUI (e.g., the GUI 16) as described herein. In certain embodiments, the GUI is presented in a web browser and the interpolation tables are stored in a storage. The storage may be local and/or remote to the computer system hosting the web browser. In an example, the GUI (through communication with at least one processor) first determines which type of rack is being simulated (e.g., stand-alone, middle, or end). Second, with the rack type(s) known in the pod, the ambient temperature $T_{amb}$ and thermal emissivity $\varepsilon$ are used to determine the constants of the exponential function for $R_{amb}$. In certain embodiments, one or more of the most closely matching table entries to the provided the ambient temperature $T_{amb}$ and thermal emissivity $\varepsilon$ are averaged or combined in a weighted sum. Each table entry specifies an interpolation of the exponential function for $R_{amb}$ with the data obtained from over 1000 CFD simulations.

Figure 8:
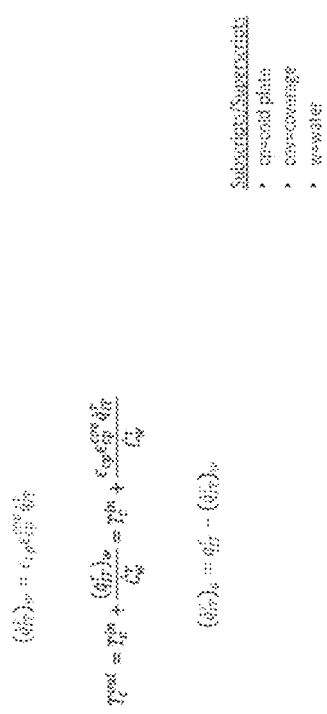
FIG. 8 illustrates an example calculation for direct-to-chip cooled racks of a thermal design tool for IT rooms housing one or more liquid-cooled pods of racks in accordance with various embodiments of the disclosure.

FIG. 8 illustrates an example calculation for direct-to-chip cooled racks for designing liquid cooled IT room architectures. Since the fraction of heat covered by cold plates and the cold effectiveness are given, the total heat transferred to the water and the air can be directly computed. $T_c^{out}$ can be computed from an energy balance on the water. Additionally, the heat transferred to the room air is the difference between the total power dissipation and the heat transferred to the air.

FIG. 9 illustrates an example calculation for chilled-water temperature and floor area for designing liquid cooled IT room architectures. For the minimum floor area per pod shown in FIG. 9, the minimum floor area is enforced in the GUI tool input values. This example assumes a minimum aisle spacing of 4 ft around the perimeter of the pod, 2 ft wide×3.5 ft deep racks, and a 3 ft hot aisle.

Figure 10:
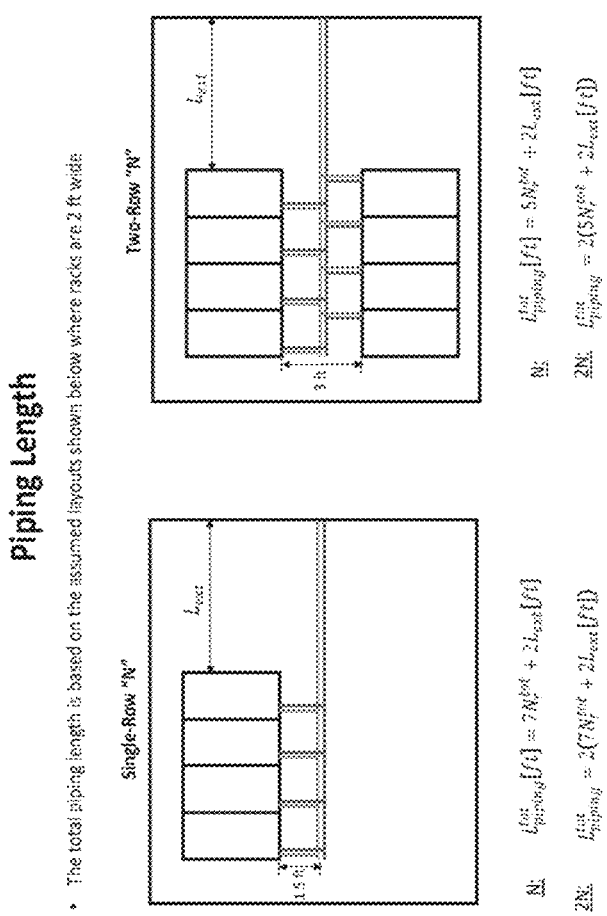
FIG. 10 illustrates an example calculation for piping length of a thermal design tool for IT rooms housing one or more liquid-cooled pods of racks in accordance with various embodiments of the disclosure.

FIG. 10 illustrates an example calculation for piping length for designing liquid cooled IT room architectures. On the left-hand side of FIG. 10, a single-row server rack layout is provided. On the right-hand side of FIG. 10, a double-row server rack layout is provided. In both layouts, a distance $L_{ext}$ is provided to indicate the distance between the ambient wall and the external skin surface temperature.

FIG. 11 illustrates an example piping heat transfer calculation for designing liquid cooled IT room architectures. This calculation assumes that the piping in its entirety can be represented as a horizontal cylinder with skin temperature equal to the average of the chilled-water supply and return temperatures. A natural-convection heat transfer coefficient is estimated and total piping heat transfer $q_{piping}$ per the equations in FIG. 11.

Figure 12:
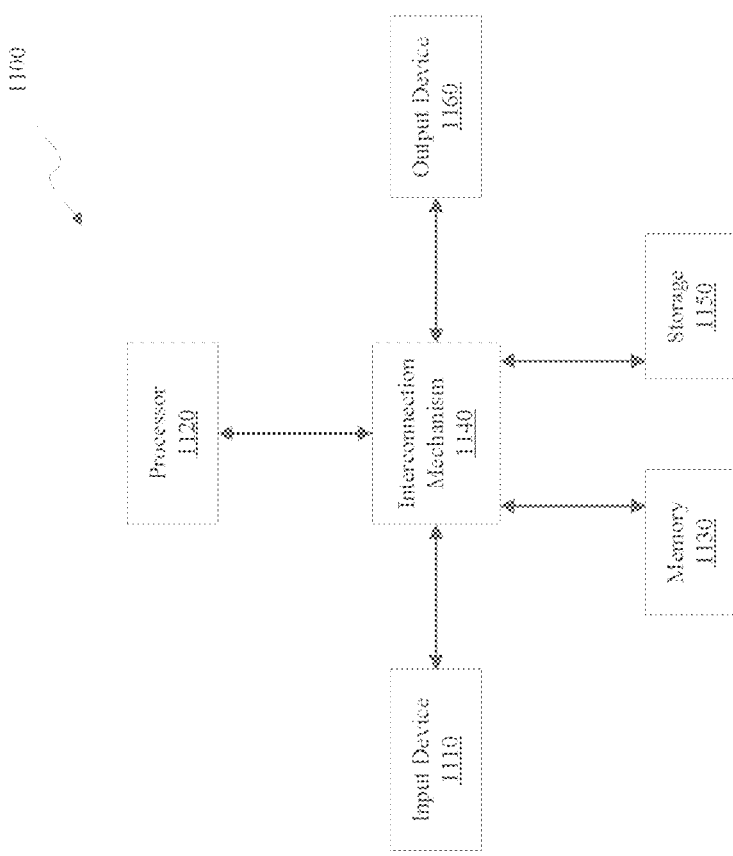
FIG. 12 is a functional block diagram of a general-purpose computer system in accordance with embodiments of this disclosure.

Various embodiments of the disclosure may be implemented as specialized software executing in a computer system 1100 such as that shown in FIG. 12. The computer system 1100 may include a processor 1120 connected to one or more memory devices 1130, such as a disk drive, memory, or other device for storing data. Memory 1130 is typically used for storing programs and data during operation of the computer system 1100. The computer system 1100 may also include a storage system 1150 that provides additional storage capacity. Components of computer system 1100 may be coupled by an interconnection mechanism 1140, which may include one or more busses (e.g., between components that are integrated within the same machine) and/or a network (e.g., between components that reside on separate discrete machines). The interconnection mechanism 1140 enables communications (e.g., data, instructions) to be exchanged between system components of system 1100.

Computer system 1100 also includes one or more input devices 1110, for example, a keyboard, mouse, trackball, microphone, touch screen, and one or more output devices 1160, for example, a printing device, display screen, speaker. In addition, computer system 1100 may contain one or more interfaces (not shown) that connect computer system 1100 to a communication network (in addition or as an alternative to the interconnection mechanism 1140).

Figure 13:
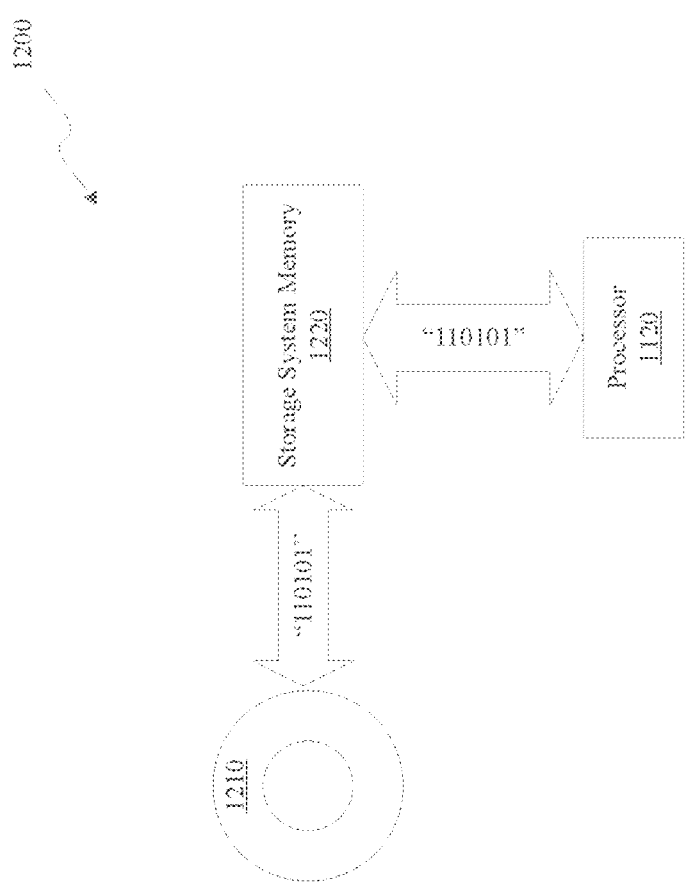
FIG. 13 is a functional block diagram of a general-purpose storage system in accordance with the general-purpose computer system of FIG. 12.

The storage system 1150, shown in greater detail in FIG. 13, typically includes a computer readable and writeable nonvolatile recording medium 1210 in which signals are stored that define a program to be executed by the processor or information stored on or in the medium 1210 to be processed by the program to perform one or more functions associated with embodiments described herein. The medium may, for example, be a disk or flash memory. Typically, in operation, the processor causes data to be read from the nonvolatile recording medium 1210 into another memory 1220 that allows for faster access to the information by the processor than does the medium 1210. This memory 1220 is typically a volatile, random access memory such as a Dynamic Random-Access Memory (DRAM) or Static RAM (SRAM). It may be located in storage system 1200, as shown, or in memory system 1130. The processor 1120 generally manipulates the data within the integrated circuit memory 1130, 1220 and then copies the data to the medium 1210 after processing is completed. A variety of mechanisms are known for managing data movement between the medium 1210 and the integrated circuit memory element 1130, 1220, and the disclosure is not limited thereto. The disclosure is not limited to a particular memory system 1130 or storage system 1150.

The computer system may include specially-programmed, special-purpose hardware, for example, an application-specific integrated circuit (ASIC). Aspects of the disclosure may be implemented in software, hardware or firmware, or any combination thereof. Further, such methods, acts, systems, system elements and components thereof may be implemented as part of the computer system described above or as an independent component.

Although computer system 1100 is shown by way of example as one type of computer system upon which various aspects of the disclosure may be practiced, it should be appreciated that aspects of the disclosure are not limited to being implemented on the computer system as shown in FIG. 13. Various aspects of the disclosure may be practiced on one or more computers having a different architecture or components shown in FIG. 13. Further, where functions or processes of embodiments of the disclosure are described herein (or in the claims) as being performed on a processor or controller, such description is intended to include systems that use more than one processor or controller to perform the functions.

Computer system 1100 may be a computer system that is programmable using a high-level computer programming language. Computer system 1100 may be also implemented using specially programmed, special purpose hardware. In computer system 1100, processor 1120 is typically a commercially available processor such as the well-known Pentium class processor available from the Intel Corporation. Many other processors are available. Such a processor usually executes an operating system which may be, for example, the Windows 95, Windows 98, Windows NT, Windows 2000, Windows ME, Windows XP, Vista, Windows 7, Windows 10, or progeny operating systems available from the Microsoft Corporation, MAC OS System X, or progeny operating system available from Apple Computer, the Solaris operating system available from Sun Microsystems, UNIX, Linux (any distribution), or progeny operating systems available from various sources. Many other operating systems may be used.

The processor and operating system together define a computer platform for which application programs in high-level programming languages are written. It should be understood that embodiments of the disclosure are not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

One or more portions of the computer system may be distributed across one or more computer systems coupled to a communications network. For example, as discussed above, a computer system that determines available power capacity may be located remotely from a system manager. These computer systems also may be general-purpose computer systems. For example, various aspects of the disclosure may be distributed among one or more computer systems configured to provide a service (e.g., servers) to one or more client computers, or to perform an overall task as part of a distributed system. For example, various aspects of the disclosure may be performed on a client-server or multi-tier system that includes components distributed among one or more server systems that perform various functions according to various embodiments of the disclosure. These components may be executable, intermediate (e.g., IL) or interpreted (e.g., Java) code which communicate over a communication network (e.g., the Internet) using a communication protocol (e.g., TCP/IP). For example, one or more database servers may be used to store device data, such as expected power draw, that is used in designing layouts associated with embodiments of the present disclosure.

It should be appreciated that the disclosure is not limited to executing on any particular system or group of systems.

Also, it should be appreciated that the disclosure is not limited to any particular distributed architecture, network, or communication protocol.

Various embodiments of the present disclosure may be programmed using an object-oriented programming language, such as JavaScript, SmallTalk, Java, C++, Ada, or C# (C-Sharp). Other object-oriented programming languages may also be used. Alternatively, functional, scripting, and/or logical programming languages may be used, such as BASIC, ForTran, COBoL, TCL, or Lua. Various aspects of the disclosure may be implemented in a non-programmed environment (e.g., documents created in HTML, XML or other format that, when viewed in a window of a browser program render aspects of a graphical-user interface (GUI) or perform other functions). Various aspects of the disclosure may be implemented as programmed or non-programmed elements, or any combination thereof.

At least some embodiments of systems and methods described above are generally described for use in IT rooms having equipment racks; however, embodiments of the disclosure may be used with IT rooms without equipment racks and with facilities other than IT rooms. Some embodiments may comprise a number of computers distributed geographically.

In some embodiments, results of analyses are described as being provided in real or near real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A system for designing a liquid cooled IT room architecture for an IT room with a graphical user interface, the system comprising:
at least one processor configured to:
simultaneously display a configuration region and a results region in the graphical user interface, the configuration region including a plurality of user-selectable graphical user interface elements each corresponding to at least one equipment rack in the IT room;
receive a design parameter responsive to a user input of one of the plurality of user-selectable graphical user interface elements;
determine a dielectric fluid return temperature TJ based on an energy balance equation and a heat exchange equation; and
responsive to determining the dielectric fluid return temperature, dynamically display in the results region at least one of:
a first graph representing an amount of required room cooling power per a unit of area of the IT room, the first graph being superimposed over a fixed plurality of room cooling ranges; or
a second graph representing a surface temperature of at least one immersion-cooled equipment rack cooled by the architecture, the second graph being superimposed over a fixed plurality of surface cooling ranges.

2. The system of claim 1, wherein the first graph and the second graph are simultaneously displayed in the results region.

3. The system of claim 1, wherein dynamically display in the results region further comprises displaying at least one of:
a third graph representing a percentage of total heat load removed by liquid cooling in the architecture and/or air cooling in the architecture; or
a fourth graph representing a percentage of total heat load produced by the at least one immersion-cooled rack, at least one direct-to-chip-cooled rack, at least one air-cooled rack, or piping in the architecture.

4. The system of claim 1, wherein the at least one processor is configured to determine the dielectric fluid return temperature by calculating an overall thermal resistance $R_{amb}$ between the ambient environment and external skin of the at least one immersion-cooled equipment rack.

5. The system of claim 4, wherein $R_{amb}=\alpha e^{-\beta \Delta T^{\gamma}}$ where $\Delta T=|T_h^{in}-T_{amb}|$, $T_{amb}$ is an ambient room temperature, and $\alpha$, $\beta$ and $\gamma$ are previously-computed constants calculated over a range of thermal emissivity $\varepsilon$ and ambient temperature $T_{amb}$ values.

6. The system of claim 1, wherein the at least one processor is configured to determine the dielectric fluid return temperature by retrieving a plurality of constants from one or more stored tables of simulation data generated from a plurality of previously completed computational fluid dynamics simulations.

7. The system of claim 6, wherein the one or more stored tables include one table for stand-alone racks, one table for middle racks, or one table for end racks.

8. The system of claim 1, wherein the one of the plurality of user-selectable graphical user interface elements is a slider and the user input is a change in a position of the slider, the position of the slider corresponding to the design parameter.

9. The system of claim 8, wherein the first graph is a bar graph having a length and the second graph is a bar graph having a length, and the at least one processor is further configured to, responsive to the change in the position of the slider, automatically update the displayed length of the first bar graph and the displayed length of the second bar graph in real time.

10. A non-transitory computer-readable medium storing instructions that, when executed by one or more processors, cause the one or more processors to perform the steps comprising:
simultaneously displaying a configuration region and a results region in the graphical user interface, the configuration region including a plurality of user-selectable graphical user interface elements each corresponding to at least one equipment rack in the IT room;
receiving a design parameter responsive to a user input of one of the plurality of user-selectable graphical user interface elements;
determining a dielectric fluid return temperature $T_h^{in}$ based on an energy balance equation and a heat exchange equation; and
responsive to receiving the design parameter and determining the dielectric fluid return temperature, dynamically displaying in the results region at least one of:
a first graph representing an amount of required room cooling power per a unit of area of the IT room, the first graph being superimposed over a fixed plurality of room cooling ranges; or a second graph representing a surface temperature of at least one immersion-cooled equipment rack cooled by the architecture, the second graph being superimposed over a fixed plurality of surface cooling ranges.

11. The non-transitory computer-readable medium of claim 10 wherein dynamically displaying in the results region comprises simultaneously displaying the first graph and the second graph in the results region.

12. The non-transitory computer-readable medium of claim 10, wherein dynamically displaying in the results region further comprises displaying at least one of:

a third graph representing a percentage of total heat load removed by liquid cooling in the architecture and/or air cooling in the architecture; or a fourth graph representing a percentage of total heat load produced by the at least one immersion-cooled rack, at least one direct-to-chip-cooled rack, at least one air-cooled rack, or piping in the architecture.

13. The non-transitory computer-readable medium of claim 10, wherein determining the dielectric fluid return temperature comprises calculating an overall thermal resistance $R_{amb}$ between the ambient environment and external skin of the at least one immersion-cooled equipment rack.

14. The non-transitory computer-readable medium of claim 13, wherein $R_{amb} = \alpha e^{-\beta \Delta T^{\gamma}}$ where $\Delta T = |T_h^{in} - T_{amb}|$, $T_{amb}$ is an ambient room temperature, and $\alpha$, $\beta$ and $\gamma$ are previously-computed constants calculated over a range of thermal emissivity $\varepsilon$ and ambient temperature $T_{amb}$ values.

15. The non-transitory computer-readable medium of claim 10, wherein determining the dielectric fluid return temperature comprises retrieving a plurality of constants from one or more stored tables of simulation data generated from a plurality of previously completed computational fluid dynamics simulations.

16. The non-transitory computer-readable medium of claim 15, wherein the one or more stored tables include one table for stand-alone racks, one table for middle racks, or one table for end racks.

17. The non-transitory computer-readable medium of claim 10, wherein the one of the plurality of user-selectable graphical user interface elements is a slider and the user input is a change in a position of the slider, the position of the slider corresponding to the design parameter.

18. The non-transitory computer-readable medium of claim 17, wherein the first graph is a bar graph having a length and the second graph is a bar graph having a length, and responsive to the change in the position of the slider, the displayed length of the first bar graph and the displayed length of the second bar graph are automatically updated in real time.

19. The non-transitory computer-readable medium of claim 10, wherein the instructions, when executed by one or more processors, cause the one or more processors to perform the steps further comprising:

specifying a layout of the at least one equipment rack in the IT room responsive to a plurality of user inputs to one or more of the plurality of user-selected graphical user interface elements, the layout including one or more of a number of immersion-cooled equipment racks including the at least one immersion-cooled equipment rack, a number of the at least one direct-to-chip cooled equipment racks, a number of air-cooled equipment racks, or a length of piping.

20. The non-transitory computer-readable medium of claim 10, wherein the instructions, when executed by one or more processors, cause the one or more processors to perform the steps further comprising:

receiving the design parameter as a heat exchanger effectiveness at given reference dielectric fluid and chilled-water flowrates; and receiving a second design parameter responsive to one of the plurality of user-selectable graphical user interface elements receiving a user input, the second design parameter being a cold plate effectiveness of the at least one direct-to-chip cooled equipment racks in the architecture.

* * * * *